United States Patent
Ishikawa et al.

(10) Patent No.: US 8,493,144 B2
(45) Date of Patent: Jul. 23, 2013

(54) DISTORTION COMPENSATION DEVICE, RADIO COMMUNICATION DEVICE, AND DISTORTION COMPENSATION METHOD

(75) Inventors: Hiroyoshi Ishikawa, Kawasaki (JP); Hajime Hamada, Kawasaki (JP); Nobukazu Fudaba, Kawasaki (JP); Yuichi Utsunomiya, Kawasaki (JP); Kazuo Nagatani, Kawasaki (JP); Yasuyuki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 73 days.

(21) Appl. No.: 13/088,580

(22) Filed: Apr. 18, 2011

(65) Prior Publication Data

US 2011/0260792 A1    Oct. 27, 2011

(30) Foreign Application Priority Data

Apr. 23, 2010    (JP) ................................. 2010-100174

(51) Int. Cl.
*H03F 1/26*    (2006.01)
(52) U.S. Cl.
USPC ........................................................ 330/149
(58) Field of Classification Search
USPC .................. 330/149; 375/296, 297; 455/63.1, 455/114.3
See application file for complete search history.

(56) References Cited

U.S. PATENT DOCUMENTS

| | | | |
|---|---|---|---|
| 6,418,173 B1 * | 7/2002 | Matsuoka et al. | 375/297 |
| 7,248,643 B2 | 7/2007 | Takabayashi et al. | |
| 7,864,881 B2 | 1/2011 | Hori et al. | |
| 8,204,454 B2 * | 6/2012 | Yamaoka et al. | 330/149 |
| 2003/0067995 A1 * | 4/2003 | Matsuoka et al. | 375/296 |
| 2010/0164620 A1 * | 7/2010 | Hamada et al. | 330/149 |
| 2011/0163806 A1 * | 7/2011 | Hongo | 330/149 |

FOREIGN PATENT DOCUMENTS

| | | |
|---|---|---|
| JP | 2004-064733 A | 2/2004 |
| JP | 2006-279780 A | 10/2006 |
| JP | 2007-282066 A | 10/2007 |
| JP | 2009-200693 A | 9/2009 |

* cited by examiner

*Primary Examiner* — Khanh V Nguyen
(74) *Attorney, Agent, or Firm* — Fujitsu Patent Center

(57) ABSTRACT

A distortion compensation device includes a distortion compensation unit which compensates for a distortion generated in a power amplifier by using a polynomial in which a signal to be input into a power amplifier is raised to a power of a degree N (N is an integer larger than 0) and the raised signal is delayed by a delay number K (K is an integer larger than 0), and a polynomial adjusting unit which adjusts the degree N or the delay number K of the polynomial based on a comparison between a prescribed value, which indicates a degree of variation of the distortion generated in the power amplifier and a threshold value.

6 Claims, 16 Drawing Sheets

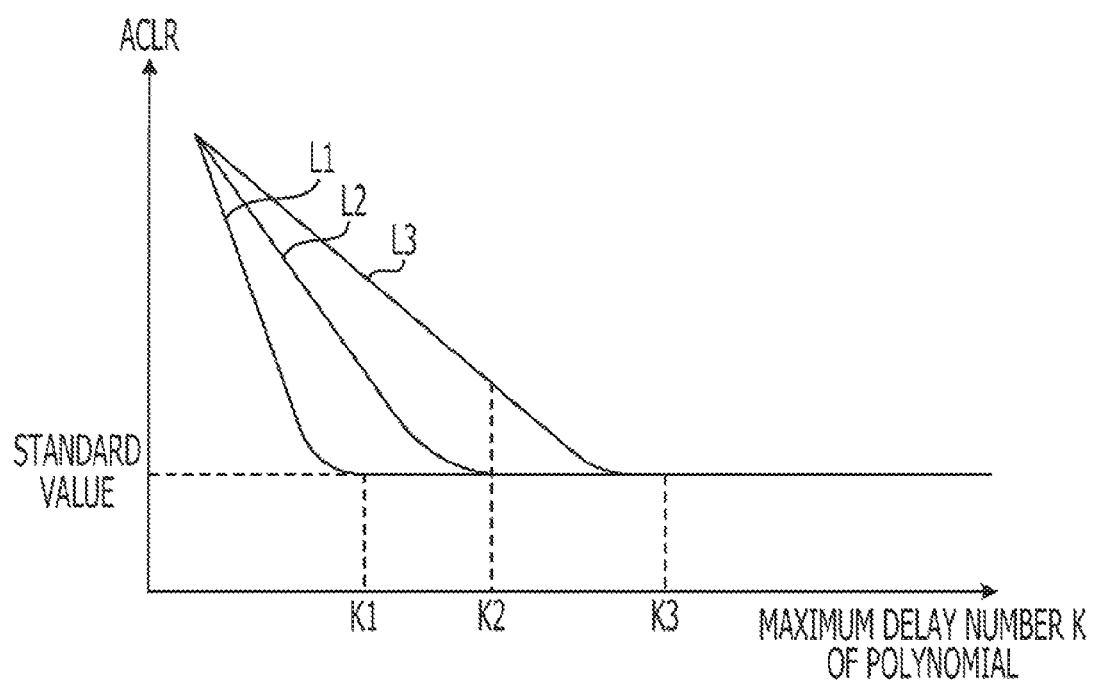

DISTORTION COMPENSATION DEVICE, RADIO COMMUNICATION DEVICE, AND DISTORTION COMPENSATION METHOD

CROSS-REFERENCE TO RELATED APPLICATIONS

This application is based upon and claims the benefit of priority from the prior Japanese Patent Application No. 2010-100174 filed on Apr. 23, 2010, the entire contents of which are incorporated herein by reference.

FIELD

The embodiments discussed herein are related to a distortion compensation device, a radio communication device, and a distortion compensation method.

BACKGROUND

In recent years, for a radio communication, various distortion compensation methods have been proposed to compensate for a distortion generated in a power amplifier. One of the above-described methods is performed to compensate for a distortion, which is generated in a power amplifier, by approximating, by a polynomial, reverse characteristics of input/output characteristics of the power amplifier and using the polynomial. Specifically, according to the above-described distortion compensation method, the distortion generated in the power amplifier is compensated by using a polynomial in which an instantaneous value of an input signal to be input into the power amplifier is raised to the power of a maximum degree N (N is an integer larger than 0).

The distortion generated in the power amplifier may be affected by a so-called memory effect. Therefore, in this case, a distortion component generated in an output signal from the power amplifier has a frequency characteristic in which the signal is varied according to a past input signal. According to the above-described distortion compensation method using the polynomial in which simply the instantaneous value of the input signal is considered, the distortion component with the frequency characteristic is difficult to be compensated.

Recently, there has been a proposal of a distortion compensation method using a polynomial in which an input signal in various times is considered so that the distortion component with the frequency characteristic is compensated. Specifically, the above-described distortion compensation method uses a polynomial in which the input signal to be input into the power amplifier is raised to the power of the maximum degree N (N is an integer larger than 0) and the raised signal is delayed by the maximum delay number K. According to the polynomial, an input signal may be expressed in a time earlier by a K sample at the largest than the current sample time, so that a desired frequency characteristic may be attached to the input signal. Therefore, according to the distortion compensation method, the distortion component with the frequency characteristic may be compensated.

SUMMARY

According to an aspect of the invention, a distortion compensation device includes a distortion compensation unit which compensates for a distortion generated in a power amplifier by using a polynomial in which a signal to be input into a power amplifier is raised to a power of a degree N (N is an integer larger than 0) and the raised signal is delayed by a delay number K (K is an integer larger than 0), and a polynomial adjusting unit which adjusts the degree N or the delay number K of the polynomial based on a comparison between a prescribed value, which indicates a degree of variation of the distortion generated in the power amplifier and a threshold value.

The object and advantages of the invention will be realized and attained at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 16 is a diagram illustrating a relation between a distortion generated in a power amplifier and a maximum delay number K of a polynomial.

DESCRIPTION OF EMBODIMENTS

Figure 1:
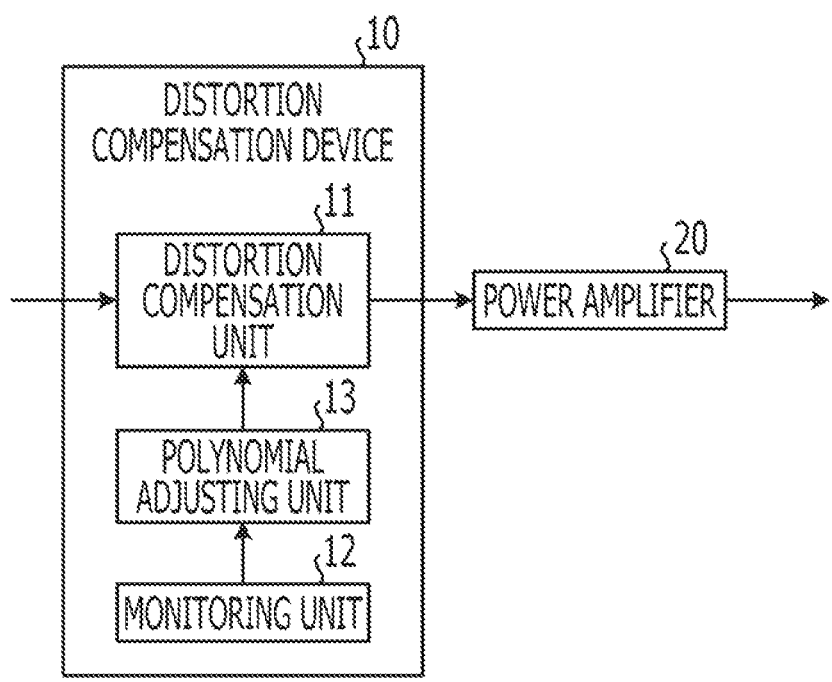
FIG. 1 is a diagram illustrating a configuration of a distortion compensation device according to a first embodiment.

The above-described conventional distortion compensation method has a problem that accuracy of distortion compensation is reduced or power consumption is increased. With reference to FIG. 16, the above-described problem will be described in detail.

FIG. 16 is a diagram illustrating a relation between a distortion generated in the power amplifier and a maximum delay number K of the polynomial. The longitudinal axis in FIG. 16 indicates an Adjacent Channel Leakage Ratio (ACLR) that represents a degree of the distortion generated in the power amplifier. The transverse axis in FIG. 16 indicates the maximum delay number K of the polynomial. Curve lines L1, L2, and L3 in FIG. 16 indicate a characteristic of the ACLR according to each operating condition when the operating condition of the power amplifier is varied. The operating condition of the power amplifier varies the distortion generated in the power amplifier. The operating condition includes, for example, a usage length, a temperature, a power of an input signal, a frequency bandwidth of the input signal, and the like.

As illustrated with the curve lines L1, L2, and L3 in FIG. 16, the characteristic of the ACLR is varied if the operating condition of the power amplifier is varied. For example, the characteristic of the ACLR is varied to the curve line L3 from the curve line L2. For the curve line L2, the maximum delay number K, which satisfies the standard value of the ACLR, indicates K2. For the curve line L3, however, the maximum delay number K, which satisfies the standard value of the ACLR, is increased to K3 from K2. In this case, according to the conventional distortion compensation method, since the maximum delay number K is indicated as K2, a fixed value, the ACLR corresponding to the maximum delay number K2 becomes larger than the standard value. As a result, the conventional distortion compensation method may not compensate, with accuracy, for the distortion generated in the power amplifier.

For example, the characteristic of the ACLR is varied to the curve line L1 from the curve line L2. For the curve line L2, the maximum delay number K that satisfies a standard value of the ACLR is indicated as K2. For the curve line L1, however, the maximum delay number K, which satisfies the standard value of the ACLR, is decreased to K1 from K2. In this case, according to the conventional distortion compensation method, since the maximum delay number K is indicated as K2, a fixed value, calculation of the polynomial is performed by the maximum delay number K2 that is larger than the maximum delay number K1, which satisfies the standard value of the ACLR. As a result, according to the conventional distortion compensation method, wasteful calculation is performed for a difference between the maximum delay number K1 and the maximum delay number K2, so that power consumption of the whole device is increased.

Although the description is omitted, the relation between the distortion generated in the power amplifier and a maximum degree N of the polynomial is equivalent to the relation illustrated in FIG. 16. Due to this, according to the conventional distortion compensation method, if the distortion generated in the power amplifier is varied, the accuracy of distortion compensation is reduced or the power consumption is increased.

The disclosed technique was invented to solve the above-described problem. An aspect of the invention is to provide a distortion compensation device, a radio communication device, and a distortion compensation method for suppressing an increase of the power consumption while the accuracy of distortion compensation is maintained.

To solve the above-described problems and achieve the aspect of the invention, the distortion compensation device disclosed in the present invention includes a distortion compensation unit that compensates for the distortion generated in the power amplifier by using a polynomial in which a signal to be input into the power amplifier is raised to the power of the maximum degree N (N is an integer larger than 0) and the raised signal is delayed by the maximum delay number K (K is an integer larger than 0), and includes a polynomial adjusting unit that adjusts the maximum degree N or the maximum delay number K of the polynomial based on a comparison between a prescribed value, which indicates a degree of variation of the distortion generated in the power amplifier, and a threshold value.

The disclosed distortion compensation device achieves an advantage in that the increase of the power consumption may be suppressed while the accuracy of distortion compensation is maintained.

With reference to the diagrams, the distortion compensation device, the radio communication device, and the distortion compensation method disclosed will be described below in detail. The distortion compensation device, the radio communication device, and the distortion compensation method disclosed are not limited to the embodiments described below.

With reference to FIG. 1, a configuration of a distortion compensation device according to a first embodiment will be described. FIG. 1 is a diagram illustrating the configuration of the distortion compensation device according to the first embodiment. As illustrated in FIG. 1, a distortion compensation device 10 according to the first embodiment includes a distortion compensation unit 11, a monitoring unit 12, and a polynomial adjusting unit 13.

By using the polynomial in which a signal to be input into a power amplifier 20 is raised to the power of the maximum degree N (N is an integer larger than 0) and the raised signal is delayed by the maximum delay number K (K is an integer larger than zero), the distortion compensation unit 11 compensates for the distortion generated in the power amplifier 20. The monitoring unit 12 monitors a prescribed value that indicates a degree of variation from the standard value of the distortion generated in the power amplifier 20. The standard value for monitoring the variation may be set to, for example, an arbitrary value such as the ACLR value, even not as the standard value, where distortion compensation performance indicates the highest value. The distortion compensation unit 11 is achieved as, for example, a Digital Signal Processor (DSP) or a Field Programmable Gate Array (FPGA) inside a radio device.

If the prescribed value monitored by the monitoring unit 12 is equal to or larger than the threshold value, the polynomial adjusting unit 13 increases the maximum degree N or the maximum delay number K of the polynomial used by the distortion compensation unit 11. Furthermore, if the prescribed value monitored by the monitoring unit 12 is smaller than the threshold value, the polynomial adjusting unit 13 reduces the maximum degree N or the maximum delay number K of the polynomial used by the distortion compensation unit 11.

As described above, when compensating, by using the polynomial, for the distortion generated in the amplifier 20, the distortion compensation device 10 according to the first embodiment monitors the prescribed value that indicates the degree of variation from the standard value of the distortion generated in the power amplifier 20. The distortion compensation device 10 according to the first embodiment increases or decreases the maximum degree N or the maximum delay number K of the polynomial according to the monitored prescribed value. That is, if the distortion generated in the power amplifier 20 is varied from the standard value, the distortion compensation device 10 according to the first embodiment increases the current maximum degree N or the current maximum delay number K up to the maximum degree or the maximum delay number that satisfies the standard value. If the distortion generated in the power amplifier 20 is not varied from the standard value, the distortion compensation device 10 according to the first embodiment decreases the current maximum degree N or the current maximum delay number K within a range where the standard value is satisfied. As a result, the distortion compensation device 10 according to the first embodiment may suppress the increase of the power consumption while maintaining the accuracy of distortion compensation.

A radio communication device that includes a distortion compensation device according to the second embodiment will be described. When compensating for the distortion generated in the power amplifier using the polynomial, the radio communication device according to the second embodiment monitors an error between a signal to be input into the power amplifier and a signal to be output from the power amplifier as an example of a prescribed value indicating a degree of variation from the standard value of the distortion of the power amplifier. The radio communication device according to the second embodiment increases or decreases the maximum degree or the maximum delay number of the polynomial according to the monitored error.

Figure 2:
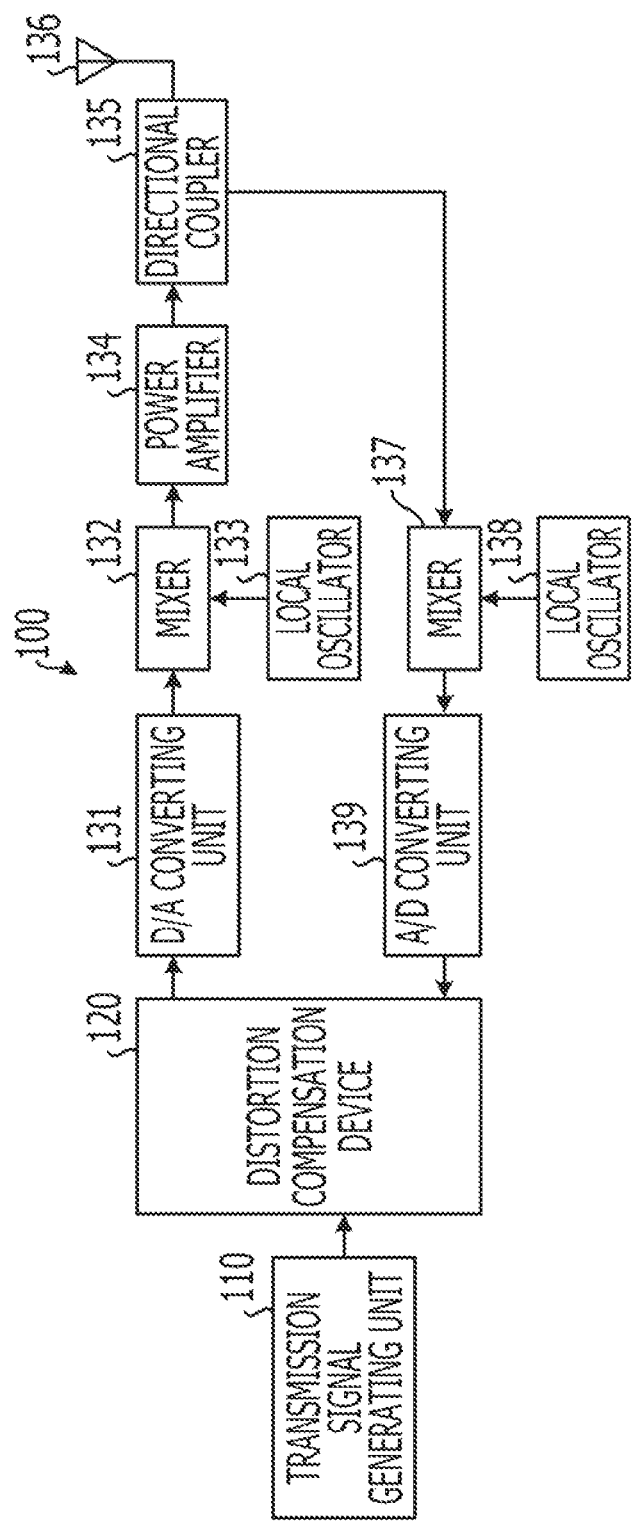
FIG. 2 is a diagram illustrating a configuration of a radio communication device with a distortion compensation device according to a second embodiment.

With reference to FIG. 2, a configuration of the radio communication device with the distortion compensation device according to the second embodiment will be described. FIG. 2 is a diagram illustrating a configuration of a radio communication device 100 that includes a distortion compensation device 120 according to the second embodiment. The radio communication device 100 illustrated in FIG. 2 is used as a radio communication device such as a radio base station, for example. As illustrated in FIG. 2, the radio communication device 100 includes a transmission signal generating unit 110, a distortion compensation device 120, a Digital/Analog (D/A) converting unit 131, a mixer 132, a local oscillator 133, a power amplifier 134, a directional coupler 135, and an antenna 136. The radio communication device 100 further includes a mixer 137, a local oscillator 138, and an A/D converting unit 139.

The transmission signal generating unit 110 generates and outputs a transmission signal to the distortion compensation device 120. Specifically, for example, to generate an Orthogonal Frequency Division Multiplexing (OFDM) signal, the transmission signal generating unit 110 temporarily converts a signal, which is generated as a digital data sequence in serial, into a digital data sequence in parallel and then performs Inverse Fast Fourier Transform (IFFT). The transmission signal generating unit 110 converts the signal subjected to the IFFT into a digital data sequence in serial, and then outputs the signal as a transmission signal to the distortion compensation device 120.

Figure 3:
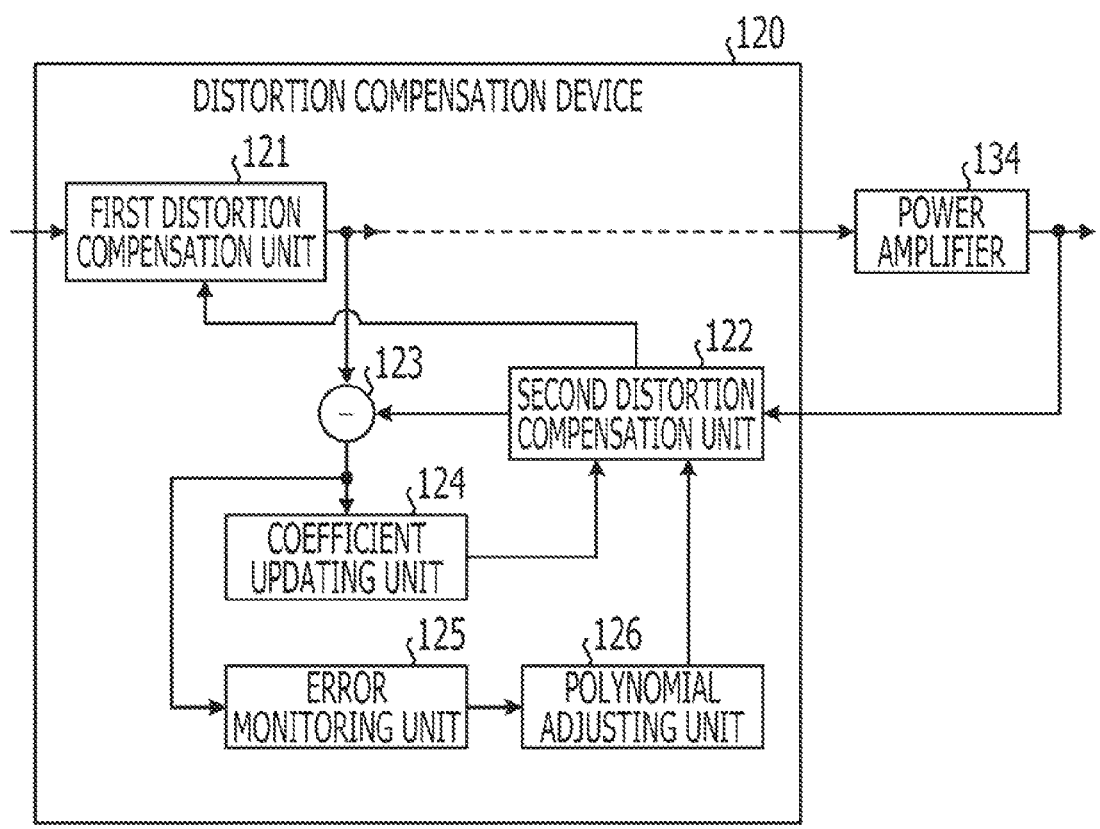
FIG. 3 is a diagram illustrating a configuration of the distortion compensation device according to the second embodiment.

The distortion compensation device 120 compensates for the distortion generated in the power amplifier 134 by using the polynomial in which prescribed processing is performed on the transmission signal input from the transmission signal generating unit 110. The distortion compensation device 120 outputs the transmission signal with the compensated distortion to the D/A converting unit 131. With reference to FIG. 3, the distortion compensation device 120 will be described.

The D/A converting unit 131 converts the digital transmission signal input from the distortion compensation device 120 into an analog baseband signal and then outputs the converted transmission signal to the mixer 132. The mixer 132 converts the frequency of the transmission signal input from the D/A converting unit 131 based on the frequency of the signal input from the local oscillator 133 and then outputs the converted transmission signal to the power amplifier 134. The local oscillator 133, which is a Phase Locked Loop (PLL) circuit, for example, detects a phase difference between an input signal and an output signal, controls a Voltage Controlled Oscillator (VCO), oscillates a signal with a fixed frequency, and outputs the oscillated signal to the mixer 132.

The power amplifier 134 amplifies the power of the transmission signal input from the mixer 132 and outputs the amplified transmission signal to the directional coupler 135. As illustrated in L1, L2, and L3 in FIG. 16, the distortion generated in the power amplifier 134 according to the second embodiment is assumed to be varied according to variation of the operating condition of the power amplifier 134.

The directional coupler 135, which is, for example, a coupler or the like, outputs the transmission signal input from the power amplifier 134 to the antenna 136 and the mixer 137. Hereinafter, the signal to be output from the directional coupler 135 to the mixer 137 may be called a "feedback signal." The antenna 136 radiates the transmission signal input from the directional coupler 135 into the air.

The mixer 137 converts the frequency of the feedback signal, which is input from the directional coupler 135, based on the frequency of the signal input from the local oscillator 138 and outputs the converted feedback signal to the A/D converting unit 139. The local oscillator 138, which is a PLL circuit, for example, detects the phase difference between the input signal and the output signal, controls the VCO, oscillates the signal with the fixed frequency, and outputs the oscillated signal to the mixer 137.

The A/D converting unit 139 outputs the feedback signal input from the mixer 137 to the distortion compensation device 120. In this manner, the directional coupler 135, the mixer 137, and the A/D converting unit 139 perform feedback on the signal output from the power amplifier 134 to the distortion compensation device 120.

With reference to FIG. 3, the configuration of the distortion compensation device 120 will be described. FIG. 3 is a diagram illustrating the configuration of the distortion compensation device 120 according to the second embodiment. As illustrated in FIG. 3, the distortion compensation device 120 includes a first distortion compensation unit 121, a second distortion compensation unit 122, a subtractor 123, a coefficient updating unit 124, an error monitoring unit 125, and a polynomial adjusting unit 126.

The first distortion compensation unit 121 compensates for the distortion, which is generated in the power amplifier 134, by using the polynomial in which a transmission signal to be input from the transmission signal generating unit 110 is raised to the power of the maximum degree N (N is an integer larger than 0) and the raised transmission signal is delayed by the maximum delay number K (K is an integer larger than 0). Specifically, by using the following polynomial series as an example of the polynomial, the first distortion compensation unit 121 generates a pre-distortion signal in which a distortion opposite to the distortion generated in the power amplifier 134 is previously attached to the transmission signal.

$$y(n) = \sum_{k=0}^{K} \sum_{l=0}^{N} h_{k,l} x(n-k)|x(n-k)|^l \quad (1)$$

y(n): Pre-distortion signal
x(n): Input signal in Current sample time n
k: Delay number (K is an integer larger than 0)
l: Degree (l is an integer larger than 0)
h: Coefficient to be set corresponding to value of l and k
N: Maximum degree
K: Maximum delay number In the above-described formula, x(n−k) indicates the input signal in the time (n−k) before the current sample time n by the k sample.

The first distortion compensation unit 121 outputs the generated pre-distortion signal to the power amplifier 134 through the D/A converting unit 131 and the mixer 132 and then compensates for the distortion, which is generated in the power amplifier 134, by offsetting the distortion generated in the power amplifier 134 by the pre-distortion signal.

By using the polynomial in which the feedback signal to be input from the A/D converting unit 139 is raised to the power of the maximum degree N and the raised signal is delayed by the maximum delay number K, the second distortion compensation unit 122 compensates for the distortion generated in the power amplifier 134. Specifically, by using the polynomial series expressed in the above-described formula (1), the second distortion compensation unit 122 generates the pre-distortion signal in which the distortion opposite to the distortion generated in the power amplifier 134 is previously attached to the feedback signal. The second distortion compensation unit 122 outputs the generated pre-distortion signal to the subtractor 123.

The second distortion compensation unit 122 periodically sets a coefficient h, the maximum degree N, and the maximum delay number K in the polynomial series used by the second distortion compensation unit 122 to the coefficient h, the maximum degree N, and the maximum delay number K in the polynomial series used by the first distortion compensation unit 121, respectively. The first distortion compensation unit 121 and the second distortion compensation unit 122 are examples of the distortion compensation unit 11 illustrated in FIG. 1.

The subtractor 123 calculates an error between the pre-distortion signal input from the first distortion compensation unit 121 and the pre-distortion signal input from the second distortion compensation unit 122 and then outputs the calculated error of the pre-distortion signal to the coefficient updating unit 124 and the error monitoring unit 125.

Based on the error of the pre-distortion signal input from the subtractor 123, the coefficient updating unit 124 updates the coefficient of each term included in the polynomial used by the second distortion compensation unit 122. For example, by adaptive signal processing using a Least Mean Square (LMS) algorithm or the like, the coefficient updating unit 124 updates the coefficient of each term included in the polynomial in such a way that the error of the pre-distortion signal input from the subtractor 123 becomes 0.

Figure 4:
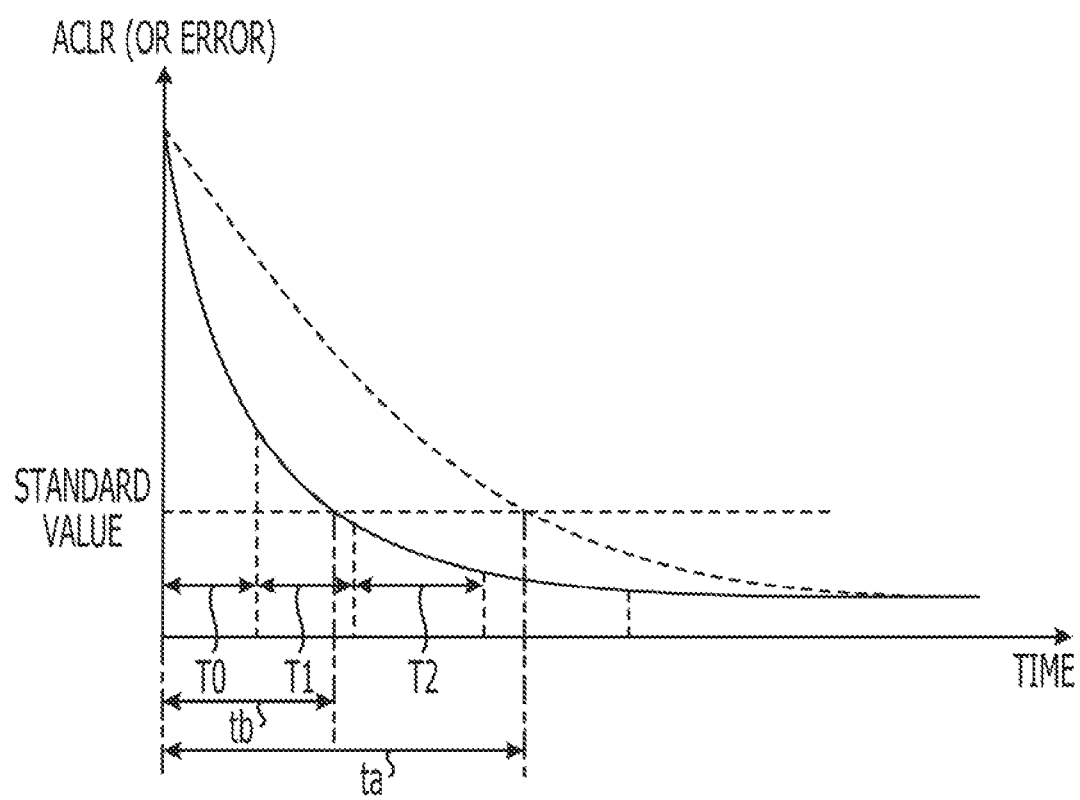
FIG. 4 is a diagram illustrating processing by a coefficient updating unit.

The coefficient updating unit 124 updates the coefficient of each term included in the polynomial, which is used by the second distortion compensation unit 122, in ascending order of the degree or the delay number corresponding to the coefficient. With reference to FIG. 4, the processing by the coefficient updating unit 124 will be described. FIG. 4 is a diagram illustrating the processing by the coefficient updating unit 124. The longitudinal axis in FIG. 4 indicates the ACLR of the power amplifier 134 or the error of the pre-distortion signal. The transverse axis in FIG. 4 indicates the processing time by the coefficient updating unit 124. In the example illustrated in FIG. 4, a Time T0 indicates a desired time for updating the coefficient corresponding to the degree 0 or the delay number 0 among the coefficients of the terms included in the polynomial. Among the coefficients of the terms included in the polynomial, a Time T1 indicates a desired time for updating the coefficient corresponding to the degree 1 or the delay number 1. Among the coefficients of the terms included in the polynomial, a Time T2 indicates a desired time for updating the coefficient corresponding to the degree 2 or the coefficient corresponding to the delay number 2.

As illustrated in the diagrams, among the coefficients of the terms included in the polynomial used by the second distortion compensation unit 122, the coefficient updating unit 124 starts updating the coefficient corresponding to the degree 0 or the delay number 0. The coefficient updating unit 124 determines whether the ACLR of the power amplifier 134 or the error of the pre-distortion signal is decreased. If the ACLR of the power amplifier 134 or the error of the pre-distortion signal is decreased, the coefficient updating unit 124 again updates the coefficient corresponding to the degree 0 or the delay number 0. On the other hand, if the ACLR of the power amplifier 134 or the error of the pre-distortion signal is not decreased, the coefficient updating unit 124 increments the times of coefficient updating by 1 and starts updating the coefficient corresponding to the degree 1 or the delay number 1. In the example illustrated in FIG. 4, the Time T0 elapses until the coefficient updating unit 124 starts updating the coefficient corresponding to the degree 1 or the delay number 1 after starting updating the coefficient corresponding to the degree 0 or the delay number 0.

The coefficient updating unit 124 determines whether the ACLR of the power amplifier 134 or the error of the pre-distortion signal is decreased or not. If the ACLR of the power amplifier 134 or the error of the pre-distortion signal is decreased, the coefficient updating unit 124 again updates the coefficient corresponding to the degree 1 or the delay number 1. On the other hand, if the ACLR of the power amplifier 134 or the error of the pre-distortion signal is not decreased, the coefficient updating unit 124 increments the times of coefficient updating by 1 and starts updating the coefficient corresponding to the degree 2 or the delay number 2. In the example illustrated in FIG. 4, the time T1 has passed until the coefficient updating unit 124 starts updating the coefficient corresponding to the degree 2 or the delay number 2 after starting updating the coefficient corresponding to the degree 1 or the delay number 1. The coefficient updating unit 124 repeats the above-described processing until the number of times of updating of the coefficient reaches the maximum degree N or the maximum delay number K.

In this manner, the coefficient updating unit 124 updates the coefficient of each term included in the polynomial used by the second distortion compensation unit 122 in ascending order of the degree or the delay number corresponding to the coefficient. In general, if the degree or the delay number of the coefficient is low, the ratio of decrease of the ACLR of the power amplifier 134 or the error of the pre-distortion signal may be large. Therefore, the radio communication device 100 may shorten the processing time in which the ACLR of the power amplifier 134 or the error of the pre-distortion signal satisfies the standard value after starting updating the coefficient of each term included in the polynomial. In the example of FIG. 4, the radio communication device 100 may shorten a processing time ta, by a conventional method for updating all the coefficients of the terms included in the polynomial at almost the same time, to a processing time tb.

The error monitoring unit 125 monitors the error between the signal input into the power amplifier 134 and the signal output from the power amplifier 134 as an example of the prescribed value indicating a degree of variation from the standard value of the distortion generated in the power amplifier 134. Specifically, the error monitoring unit 125 monitors the error of the pre-distortion signal input from the subtractor 123. For example, the error monitoring unit 125 periodically monitors the error of the pre-distortion signal and outputs the monitoring result to the polynomial adjusting unit 126. The error monitoring unit 125 is an example of the monitoring unit 12 illustrated in FIG. 1.

Figure 5:
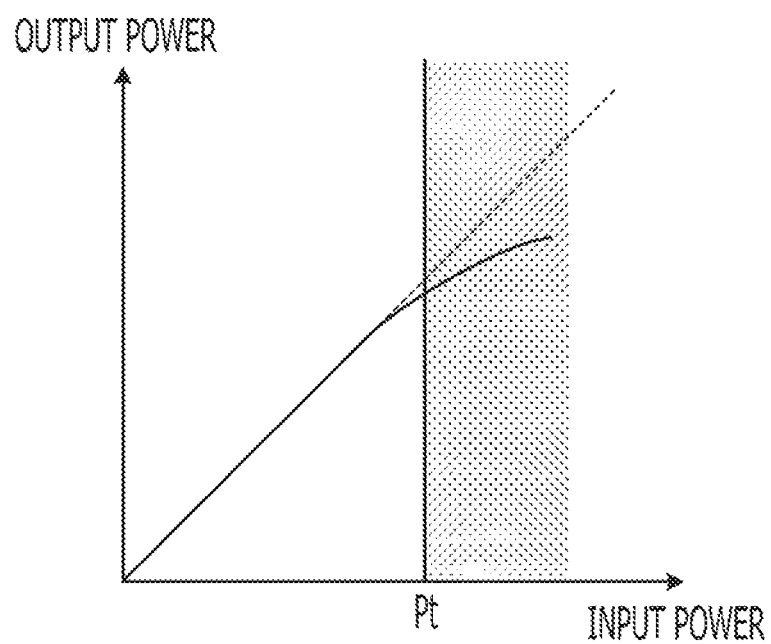
FIG. 5 is a diagram illustrating processing by an error monitoring unit.

The error monitoring unit 125 measures a power of the signal input into the power amplifier 134 and may monitor the error of the pre-distortion signal if the measured power is equal to or larger than a prescribed value. FIG. 5 is a diagram illustrating processing by the error monitoring unit 125. The longitudinal axis in FIG. 5 indicates the power of the signal output from the power amplifier 134. The transverse axis in FIG. 5 indicates the power of the signal input into the power amplifier 134. Hereinafter, the power of the signal output from the power amplifier 134 may be referred to as an "output power," and the power of the signal input into the power amplifier 134 may be referred to as an "input power."

In the example illustrated in FIG. 5, if the input power is larger than a prescribed value Pt, the input power and the output power have a non-linear relation. In other words, the output power is saturated if the input power is equal to or larger than the prescribed value Pt. Therefore, if the input power is equal to or larger than the prescribed value Pt, the error of the pre-distortion signal may be large. However, if the input power is smaller than the prescribed value Pt, the input power and the output power have a linear relation, so that less distortion is generated in the power amplifier 134. Therefore, if the input power is smaller than the prescribed value Pt, the error of the pre-distortion signal may be small. The error monitoring unit 125 monitors the error of the pre-distortion signal if the input power is equal to or larger than the pre-scribed value Pt. The error monitoring unit 125 does not monitor the error of the pre-distortion signal if the input power is smaller than the prescribed value Pt. Accordingly, the radio communication device 100 omits the processing of monitoring the error of the pre-distortion signal if the input power is smaller than the prescribed value Pt. As a result, the error monitoring performance may be improved.

As illustrated in FIG. 3, according to the monitoring result input from the error monitoring unit 125, the polynomial adjusting unit 126 increases or decreases the maximum degree N or the maximum delay number K of the polynomial used by the second distortion compensation unit 122. Specifically, if the error of the pre-distortion signal monitored by the error monitoring unit 125 is equal to or larger than a threshold value Th1, the polynomial adjusting unit 126 increases the maximum degree or the maximum delay number K used by the second distortion compensation unit 122. On the other hand, the polynomial adjusting unit 126 decreases the maximum degree N or the maximum delay number K of the polynomial used by the second distortion compensation unit 122 if the error of the pre-distortion signal monitored by the error monitoring unit 125 is smaller than the threshold value Th1. The polynomial adjusting unit 126 is an example of the polynomial adjusting unit 13 illustrated in FIG. 1.

The processing by the polynomial adjusting unit 126 will be described by a specific example. The polynomial adjusting unit 126 illustrates an example in which the polynomial adjusting unit 126 increases or decreases the maximum delay number K of the polynomial used by the second distortion compensation unit 122. If the error of the pre-distortion signal monitored by the error monitoring unit 125 is equal to or larger than the threshold Th1, the polynomial adjusting unit 126 increments the maximum delay number K of the polynomial, which is used by the second distortion compensation unit 122, by 1. If the coefficient of each term included in the polynomial is updated, the polynomial adjusting unit 126 reacquires the monitoring result from the error monitoring unit 125. If the error of the pre-distortion signal monitored by the error monitoring unit 125 is equal to or larger than the threshold value Th1, the polynomial adjusting unit 126 increments the maximum delay number K of the polynomial, which is used by the second distortion compensation unit 122, by 1. If the error of the pre-distortion signal monitored by the error monitoring unit 125 is smaller than the threshold value Th1, the polynomial adjusting unit 126 ends the processing. In this manner, if the error of the pre-distortion signal monitored by the error monitoring unit 125 is equal to or larger than the threshold value Th1, the polynomial adjusting unit 126 searches the highest maximum delay number K in which the error of the pre-distortion signal is equal to or smaller than the threshold value Th1 while gradually increasing the maximum degree K. As a result, if the distortion generated in the power amplifier 134 is varied from the standard value, the radio communication device 100 may increase the current maximum delay number K to the maximum delay number that satisfies the standard value, so that the distortion generated in the power amplifier may be compensated with high accuracy.

On the other hand, if the error of the pre-distortion signal monitored by the error monitoring unit 125 is smaller than the threshold Th1, the polynomial adjusting unit 126 decrements the maximum delay number K of the polynomial, which is used by the second distortion compensation unit 122, by 1. If the coefficient of each term included in the polynomial is updated by the coefficient updating unit 124, the polynomial adjusting unit 126 reacquires the monitoring result from the error monitoring unit 125. If the error of the pre-distortion signal monitored by the error monitoring unit 125 is smaller than the threshold value Th1, the polynomial adjusting unit 126 decrements the maximum delay number K of the polynomial, which is used by the second distortion compensation unit 122, by 1. If the error of the pre-distortion signal monitored by the error monitoring unit 125 is equal to or larger than the threshold value Th1, the polynomial adjusting unit 126 increments the maximum delay number K of the polynomial, which is used by the second distortion compensation unit 122, by 1 and ends the processing. In this manner, if the error of the pre-distortion signal monitored by the error monitoring unit 125 is smaller than the threshold value Th1, the polynomial adjusting unit 126 retrieves the lowest maximum delay number K in which the error of the pre-distortion is equal to or smaller than the threshold value Th1 while gradually decreasing the maximum delay number K. Accordingly, if the distortion generated in the power amplifier 134 is not varied from the standard value, the radio communication device 100 may decrease the current maximum delay number K within the range in which the standard value is satisfied and may reduce the calculation amount by the polynomial. As a result, the radio communication device 100 may reduce the power consumption of the whole device. The width of increment or decrement such as 1 is simply an example. The width may be set to be larger according to a state of the operation. If the threshold value Th1 is set to the error to satisfy the standard value of the ACLR, the desired minimum delay number K and degree N may be obtained to satisfy the standard value.

Figure 6:
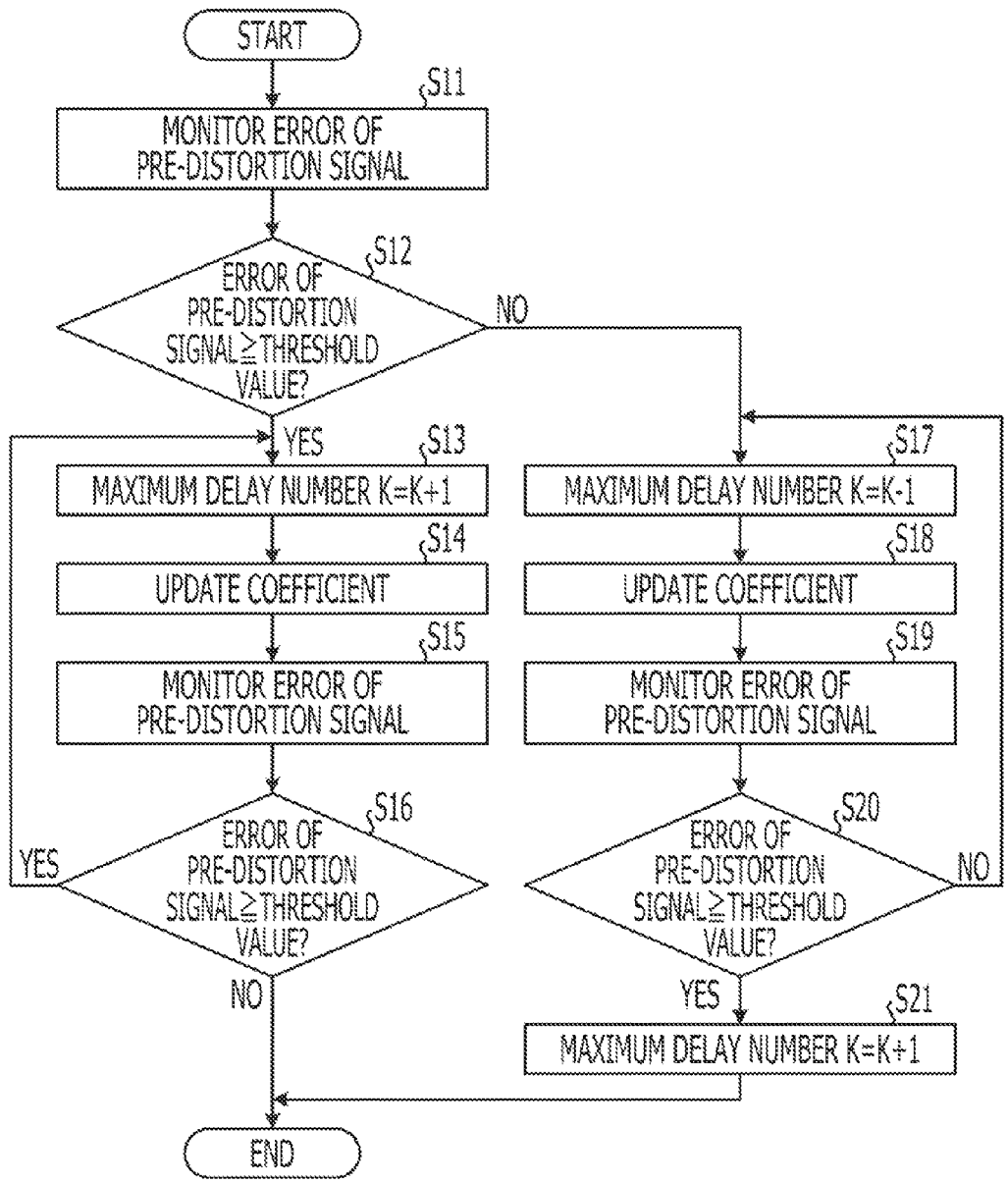
FIG. 6 is a flowchart illustrating a processing procedure by the distortion compensation device according to the second embodiment.

With reference to FIG. 6, the processing procedure by the distortion compensation device 120 according to the second embodiment will be described. FIG. 6 is a flowchart illustrating a processing procedure by the distortion compensation device 120 according to the second embodiment. FIG. 6 illustrates an example in which the distortion compensation device 120 increases the maximum delay number K of the polynomial. As illustrated in FIG. 6, the error monitoring unit 125 of the distortion compensation device 120 monitors the error of the pre-distortion signal input from the subtractor 123 (Operation S11).

The polynomial adjusting unit 126 determines whether or not the error of the pre-distortion signal monitored by the error monitoring unit 125 is equal to or larger than the threshold value Th1 (Operation S12). If the error of the pre-distortion signal monitored by the error monitoring unit 125 is equal to or larger than the threshold value Th1 (Yes in Operation S12), the polynomial adjusting unit 126 increments the maximum delay number K of the polynomial, which is used by the second distortion compensation unit 122, by 1 (Operation S13). The coefficient updating unit 124 updates the coefficient of each term included in the polynomial used by the second distortion compensation unit 122 (Operation S14).

The error monitoring unit 125 again monitors the error of the pre-distortion signal input from the subtractor 123 (Operation S15). The polynomial adjusting unit 126 reacquires the monitoring result from the error monitoring unit 125. If the error of the pre-distortion signal monitored by the error monitoring unit 125 is equal to or larger than the threshold value Th1 (Yes in Operation S16), the polynomial adjusting unit 126 increments the maximum delay number K, which is used by the second distortion compensation unit 122, by 1 (Operation S13). The coefficient updating unit 124 updates the coefficient of each term included in the polynomial used by the second distortion compensation unit 122 (Operation S14). The error monitoring unit 125 again monitors the error of the pre-distortion signal input from the subtractor 123 (Operation S15). That is, the processing in Operation S13 to Operation S16 is repeated. If the error of the pre-distortion signal monitored by the error monitoring unit 125 is smaller than the threshold value Th1 (No in Operation S16), the polynomial adjusting unit 126 ends the processing.

On the other hand, if the error of the pre-distortion signal monitored by the error monitoring unit 125 is smaller than the threshold value Th1 (No in Operation S12), the polynomial adjusting unit 126 decrements the maximum delay number K of the polynomial, which is used by the second distortion compensation unit 122, by 1 (Operation S17). The coefficient updating unit 124 updates the coefficient of each term included in the polynomial used by the second distortion compensation unit 122 (Operation S18).

The error monitoring unit 125 again monitors the error of the pre-distortion signal input from the subtractor 123 (Operation S19). The polynomial adjusting unit 126 reacquires the monitoring result from the error monitoring unit 125. If the error of the pre-distortion signal monitored by the error monitoring unit 125 is smaller than the threshold value Th1 (No in Operation S20), the polynomial adjusting unit 126 decrements the maximum delay number K of the polynomial, which is used by the second distortion compensation unit 122, by 1 (Operation S17). The coefficient updating unit 124 updates the coefficient of each term included in the polynomial used by the second distortion compensation unit 122 (Operation S18), the error monitoring unit 125 again monitors the error of the pre-distortion signal input from the subtractor 123 (Operation S19). That is, the processing in Operation S17 to Operation S20 is repeated. If the error of the pre-distortion signal monitored by the error monitoring unit 125 is equal to or larger than the threshold value Th1 (Yes in Operation S20), the polynomial adjusting unit 126 increments the maximum delay number K of the polynomial by 1 (Operation S21) and ends the processing.

Figure 7:
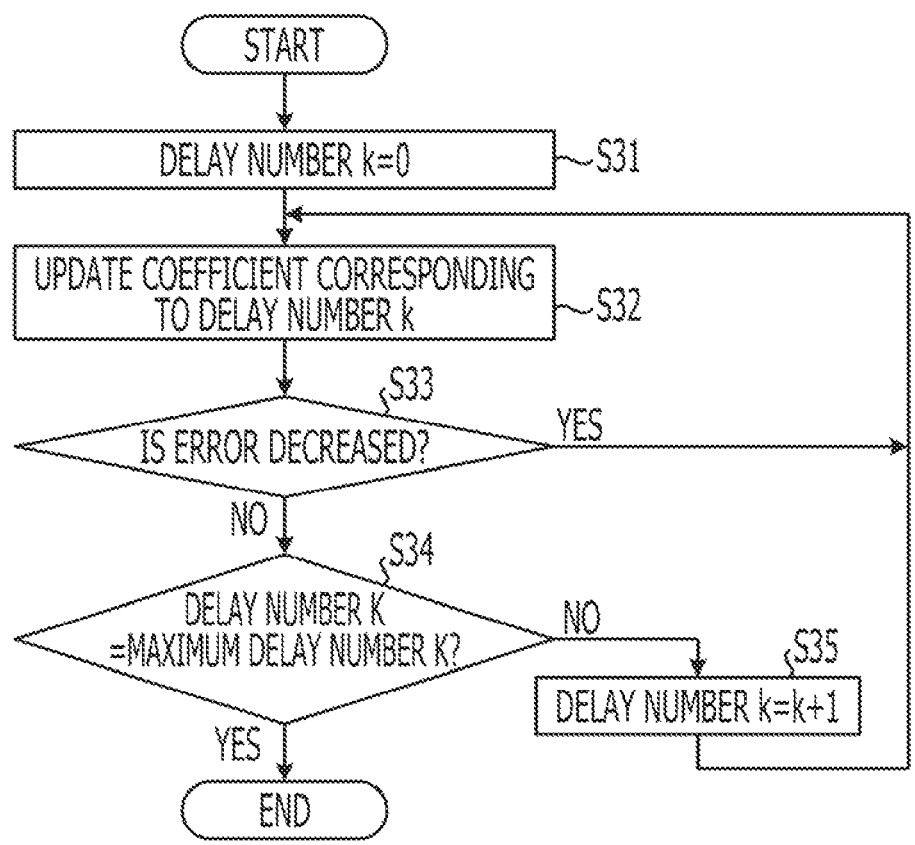
FIG. 7 is a flowchart illustrating a processing procedure by a coefficient updating unit according to the second embodiment.

With reference to FIG. 7, the processing procedure by the coefficient updating unit 124 according to the second embodiment will be described. FIG. 7 is a flowchart illustrating a processing procedure by the coefficient updating unit 124 according to the second embodiment. FIG. 7 illustrates an example in which the coefficient updating unit 124 updates the coefficient of each term included in the polynomial, used by the second distortion compensation unit 122, in the other of low delay number corresponding to the coefficient.

As illustrated in FIG. 7, the coefficient updating unit 124 sets 0 to a delay number k (Operation S31). Among the coefficients of the terms included in the polynomial used by the second distortion compensation unit 122, the coefficient updating unit 124 updates the coefficient corresponding to the delay number k (Operation S32). If the error of the pre-distortion signal is decreased (No in Operation S33), the coefficient updating unit 124 again updates the coefficient corresponding to the delay number k (Operation S32).

On the other hand, if the error of the pre-distortion signal is not decreased (No in Operation S33), the coefficient updating unit 124 determines whether or not the current delay number k reaches the maximum delay number K (Operation S34). If the current delay number k does not reach the maximum delay number K (No in Operation S34), the coefficient updating unit 124 increments the current delay number k by 1 (Operation S35). The process goes back to Operation S32, and the processing in Operation S32 to Operation S34 is repeated. On the other hand, if the current delay number k reaches the maximum delay number K (Yes in Operation S34), the coefficient updating unit 124 ends the processing.

As described above, the radio communication device 100 according to the second embodiment monitors the error of the pre-distortion signal indicates a degree of variation from the standard value of the distortion generated in the power amplifier 134. The radio communication device 100 increases the maximum degree N or the maximum delay number K of the polynomial according to the monitored error of the pre-distortion signal. Specifically, if the distortion generated in the power amplifier 134 is varied from the standard value, that is, if the error of the pre-distortion signal is equal to or larger than the threshold value Th1, the radio communication device 100 increases the current maximum degree N or the current maximum delay number K to the maximum degree or the maximum delay number that satisfies the standard value. On the other hand, if the distortion generated in the power amplifier 134 is not varied from the standard value, that is, if the error of the pre-distortion signal is smaller than the threshold value Th1, the radio communication device 100 decreases the current maximum degree N or the current delay number K within the range in which the standard value is satisfied. As a result, if the distortion generated in the power amplifier 134 is varied from the standard value, the radio communication device 100 according to the second embodiment may compensate, with high accuracy, for the distortion generated in the power amplifier 134. If the distortion generated in the power amplifier 134 is not varied from the standard value, the radio communication device 100 according to the second embodiment may reduce the power consumption of the whole device by reducing the calculation amount by the polynomial. That is, the radio communication device 100 according to the second embodiment may suppress the increase of the power consumption while maintaining the accuracy of distortion compensation.

The radio communication device 100 according to the second embodiment updates the coefficient of each term included in the polynomial in ascending order of the degree or the delay number corresponding to the coefficient. The radio communication device 100 may shorten a processing time until the ACLR of the power amplifier 134 or the error of the pre-distortion signal satisfies the standard value after the update of the coefficient of each term included in the polynomial is started.

The radio communication device with the distortion compensation device according to the third embodiment will be described. The radio communication device according to the third embodiment monitors the ACLR of the power amplifier as an example of a prescribed value indicating a degree of variation from the standard value of the distortion generated in the power amplifier. The radio communication device according to the third embodiment increases the maximum degree or the maximum delay number of the polynomial according to the monitored ACLR.

Figure 8:
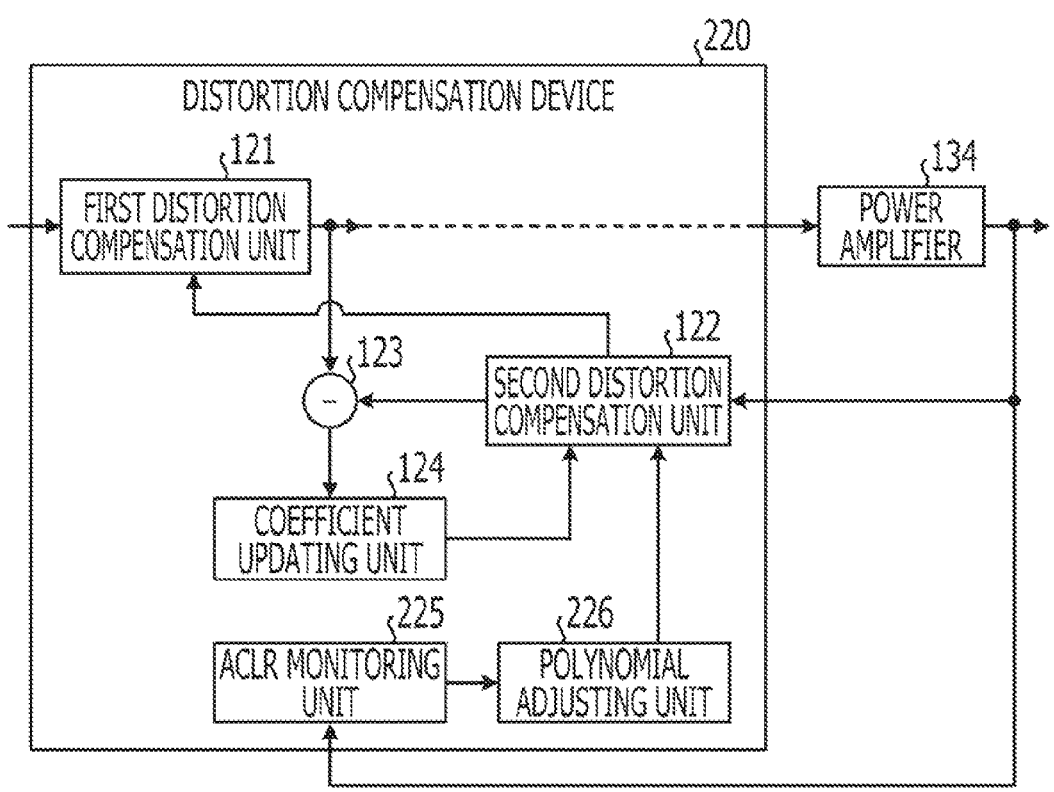
FIG. 8 is a diagram illustrating a configuration of a distortion compensation device according to a third embodiment.

The configuration of the distortion compensation device included in the radio communication device 200 according to the third embodiment will be described. FIG. 8 is a diagram illustrating a configuration of a distortion compensation device 220 according to the third embodiment. The components with the functions substantially equivalent to the components illustrated in FIG. 3 are indicated with the same numerals, and the detailed description is omitted. Since the configuration of the radio communication device 200 according to the third embodiment is substantially equivalent to the configuration illustrated in FIG. 2, the description is omitted.

As illustrated in FIG. 8, the distortion compensation device 220 includes an ACLR monitoring unit 225 and a polynomial adjusting unit 226 instead of the error monitoring unit 125 and the polynomial adjusting unit 126 included in the distortion compensation device 120 illustrated in FIG. 3.

The ACLR monitoring unit 225 monitors the ACLR of the power amplifier 134 as an example of a prescribed value indicating a degree of variation from the standard value of the distortion generated in the power amplifier 134. Specifically, the ACLR monitoring unit 225 analyzes the feedback signal input from the A/D converting unit 139 to calculate the ACLR and then monitors the calculated ACLR. For example, the ACLR monitoring unit 225 periodically calculates and monitors the ACLR. The ACLR monitoring unit 225 outputs the monitoring result to the polynomial adjusting unit 226. The ACLR monitoring unit 225 is an example of the monitoring unit 12 illustrated in FIG. 1.

Figure 9:
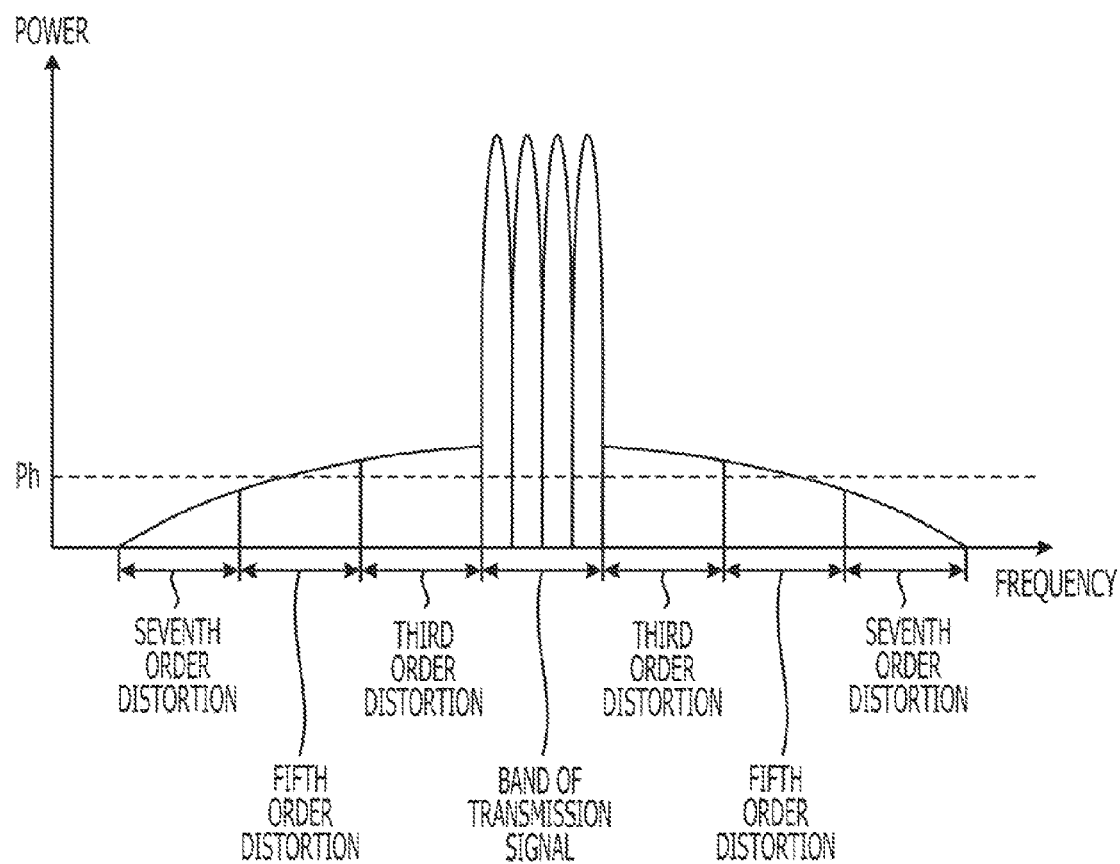
FIG. 9 is a diagram illustrating processing by an ACLR monitoring unit.

The ACLR monitoring unit 225 measures the power of the signal output from the power amplifier 134 for each frequency. The ACLR monitoring unit 225 may monitor the ACLR of the power amplifier 134 if the measured power for each frequency is equal to or larger than a prescribed value. FIG. 9 is a diagram illustrating processing by the ACLR monitoring unit 225. The longitudinal axis in FIG. 9 indicates a power of the signal output from the power amplifier 134. The transverse axis of FIG. 9 indicates a frequency of the signal output from the power amplifier 134.

If power amplification is performed in an area where the input power and the output power of the power amplifier 134 has a non-linear relation, a distortion is generated in the power amplifier 134, so that some of the signals output from the power amplifier are leaked to an adjacent channel. As illustrated in FIG. 9, the distortion generated in the power amplifier 134 appears on both sides of a band of the transmission signal in the order of the third order degree, the fifth order degree, and the seventh order degree. The ACLR monitoring unit 225 measures the ACLR for each frequency band in which a distortion of a higher order degree is generated and adjusts the maximum delay number K or the maximum degree N.

As illustrated in FIG. 9, the power of the frequency corresponding to the third order degree and the fifth order degree is equal to or larger than a prescribed value Ph, so that the ACLR monitoring unit 225 monitors the ACLR in the frequency band corresponding to the third order degree and the fifth order degree. On the other hand, the power of the frequency band corresponding to the seventh order degree distortion is smaller than the prescribed value Ph, so that the ACLR monitoring unit 225 does not monitor the ACLR in the frequency band corresponding to the seventh order degree distortion.

Figure 10:
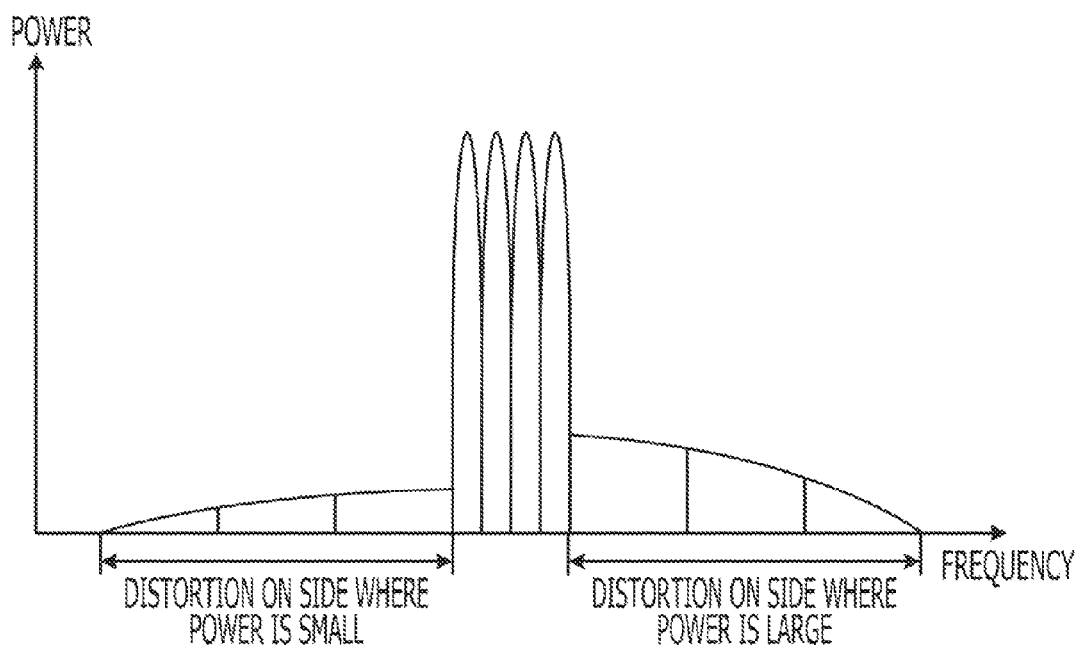
FIG. 10 is a diagram illustrating another processing by the ACLR monitoring unit.

As illustrated in FIG. 10, if the distortions appearing on the both sides of the band of the transmission signal are asymmetric, the ACLR monitoring unit 225 may measure an output power for each frequency of the distortion with a larger power from among the asymmetric distortions. FIG. 10 is a diagram illustrating another processing by the ACLR monitoring unit 225.

According to the monitoring result input from the ACLR monitoring unit 225, the polynomial adjusting unit 226 increases or decreases the maximum degree N or the maximum delay number K of the polynomial used by the second distortion compensation unit 122. Specifically, if the ACLR monitored by the ACLR monitoring unit 225 is equal to or larger than the threshold value Th1, the polynomial adjusting unit 226 increases the maximum degree N or the maximum delay number K of the polynomial used by the second distortion compensation unit 122. On the other hand, if the ACLR monitored by the ACLR monitoring unit 225 is smaller than the threshold value Th1, the polynomial adjusting unit 226 decreases the maximum degree N or the maximum delay number K used by the second distortion compensation unit 122. The polynomial adjusting unit 226 is an example of the polynomial adjusting unit 13 illustrated in FIG. 1.

The processing by the polynomial adjusting unit 226 will be described with reference to a specific example. For example, the polynomial adjusting unit 226 increases or decreases the maximum delay number K of the polynomial used by the second distortion compensation unit 122. If the ACLR monitored by the ACLR monitoring unit 225 is equal to or larger than the threshold value Th1, the polynomial adjusting unit 126 increments the maximum delay number K of the polynomial, which is used by the second distortion compensation unit 122, by 1. If the coefficient of each term included in the polynomial is updated by the coefficient updating unit 124, the polynomial adjusting unit 226 reacquires the monitoring result from the ACLR monitoring unit 225. If the ACLR monitored by the ACLR monitoring unit 225 is equal to or larger than the threshold value Th1, the polynomial adjusting unit 226 increments the maximum delay number K of the polynomial, which is used by the second distortion compensation unit 122, by 1. If the ACLR monitored by the ACLR monitoring unit 225 is smaller than the threshold value Th1, the polynomial adjusting unit 226 ends the processing. In this manner, if the ACLR monitored by the ACLR monitoring unit 225 is equal to or larger than the threshold value Th1, the polynomial adjusting unit 226 searches the highest maximum delay number K in which the ACLR is equal to or smaller than the threshold value Th1 while gradually increasing the maximum degree K. Accordingly, if the distortion generated in the power amplifier 134 is varied from the standard value, the radio communication device 200 may increase the current maximum degree N or the maximum delay number K to the maximum delay number that satisfies the standard value and may compensate, with high accuracy, for the distortion generated in the power amplifier 134.

On the other hand, if the ACLR monitored by the ACLR monitoring unit 225 is smaller than the threshold value Th1, the polynomial adjusting unit 226 decrements the maximum delay number K of the polynomial, which is used by the second distortion compensation unit 122, by 1. If the coefficient of each term included in the polynomial is updated by the coefficient updating unit 124, the polynomial adjusting unit 226 reacquires the monitoring result from the ACLR monitoring unit 225. If the ACLR monitored by the ACLR monitoring unit 225 is smaller than the threshold value Th1, the polynomial adjusting unit 226 decrements the maximum delay number K of the polynomial, which is used by the second distortion compensation unit 122, by 1. If the ACLR monitored by the ACLR monitoring unit 225 is equal to or larger than the threshold value Th1, the polynomial adjusting unit 226 increments the maximum delay number K of the polynomial, which is used by the second distortion compensation unit 122, by 1 and ends the processing. In this manner, if the ACLR monitored by the ACLR monitoring unit 225 is smaller than the threshold Th1, the polynomial adjusting unit 226 searches the lowest maximum delay number K, in which the ACLR is equal to or smaller than the threshold value Th1, while gradually decreasing the maximum delay number K. Therefore, if the distortion generated in the power amplifier 134 is not varied from the standard value, the radio communication device 200 may decrease the current delay number K within the range in which the standard value is satisfied, so that the calculation amount by the polynomial may be reduced. As a result, the radio communication device 100 may reduce the consumption power of the whole device. The width of increment or decrement such as 1 is an example. An approximate width or the like may be set according to the operation.

Figure 11:
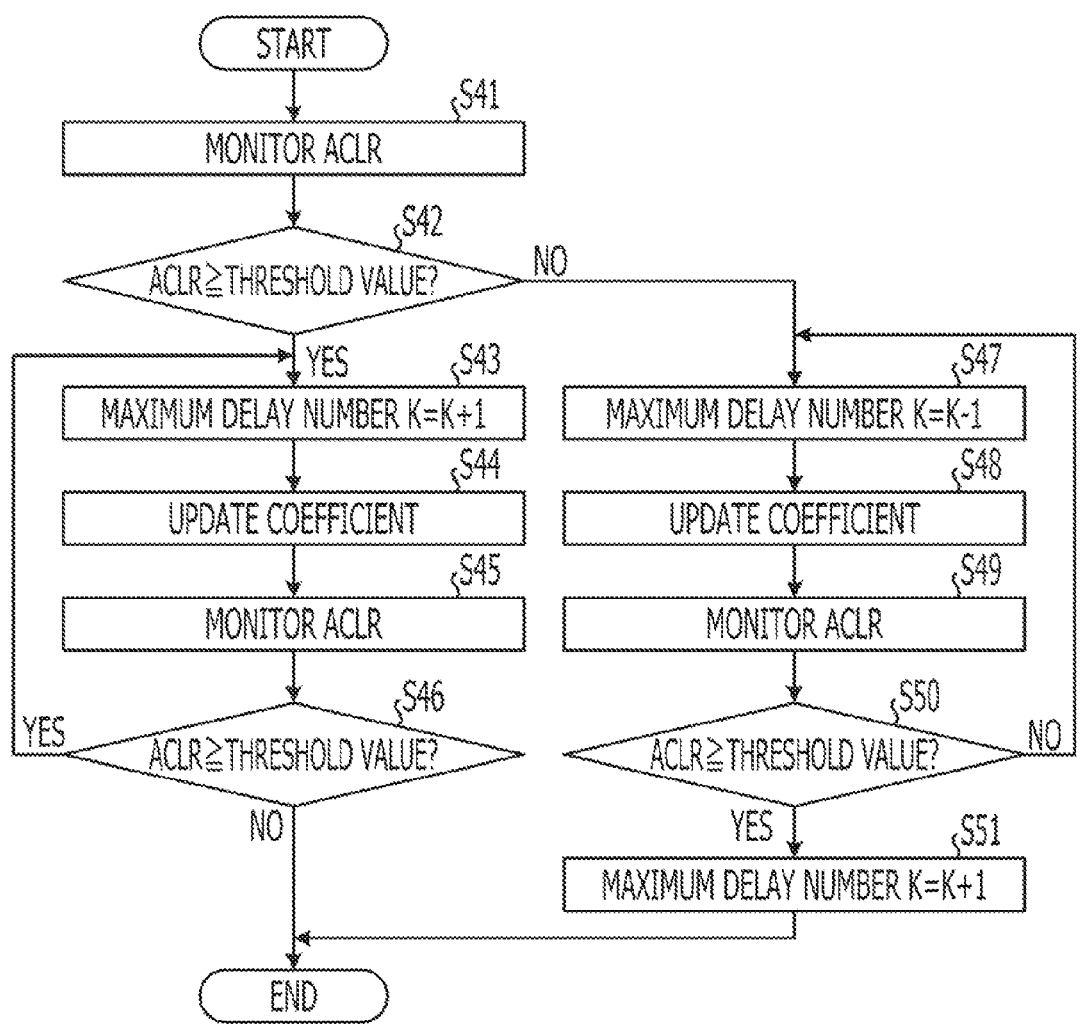
FIG. 11 is a flowchart illustrating a processing procedure by the distortion compensation device according to the third embodiment.

With reference to FIG. 11, a processing procedure by the distortion compensation device 220 according to the third embodiment will be described. FIG. 11 is a flowchart illustrating the processing procedure by the distortion compensation device 220 according to the third embodiment. FIG. 11 illustrates an example in which the distortion compensation device 220 increases or decreases the maximum delay number K of the polynomial. As illustrated in FIG. 11, the ACLR monitoring unit 225 of the distortion compensation device 220 analyzes the feedback signal input from the A/D converting unit 139 to calculate the ACLR and monitors the calculated ACLR (Operation S41).

The polynomial adjusting unit 226 determines whether or not the ACLR monitored by the ACLR monitoring unit 225 is equal to or larger than the threshold value Th1 (Operation S42). If the ACLR monitored by the ACLR monitoring unit 225 is equal to or larger than the threshold value Th1 (Yes in Operation S42), the polynomial adjusting unit 226 increments the maximum delay number K, which is used by the second distortion compensation unit 122, by 1 (Operation S43). The coefficient updating unit 124 updates the coefficient of each term included in the polynomial used by the second distortion compensation unit 122 (Operation S44).

The ACLR monitoring unit 225 analyzes the feedback signal input from the A/D converting unit 139 to calculate the ACLR and then monitors the calculated ACLR (Operation S45). The polynomial adjusting unit 226 reacquires the monitoring result from the ACLR monitoring unit 225. If the ACLR monitored by the ACLR monitoring unit 225 is equal to or larger than the threshold value Th1 (Yes in Operation S46), the polynomial adjusting unit 226 increments the maximum delay number K of the polynomial, which is used by the second distortion compensation unit 122, by 1 (Operation S43). The coefficient updating unit 124 updates the coefficient of each term included in the polynomial used by the second distortion compensation unit 122 (Operation S44), the ACLR monitoring unit 225 again monitors the ACLR (Operation S45). That is, the processing in Operation S43 to Operation S46 is repeated. If the ACLR monitored by the ACLR monitoring unit 225 is smaller than the threshold value Th1 (No in Operation S46), the polynomial adjusting unit 226 ends the processing.

On the other hand, if the ACLR monitored by the ACLR monitoring unit 225 is smaller than the threshold value Th1 (No in Operation S42), the polynomial adjusting unit 226 decrements the maximum delay number K of the polynomial, which is used by the second distortion compensation unit 122, by 1 (Operation S47). The coefficient updating unit 124 updates the coefficient of each term included in the polynomial used by the second distortion compensation unit 122 (Operation S48).

The ACLR monitoring unit 225 again monitors the ACLR (Operation S49). The polynomial adjusting unit 226 reacquires the monitoring result from the ACLR monitoring unit 225. If the ACLR monitored by the ACLR monitoring unit 225 is smaller than the threshold value Th1 (No in Operation S50), the polynomial adjusting unit 226 decrements the maximum delay number K of the polynomial, which is used by the second distortion compensation unit 122, by 1 (Operation S47). The coefficient updating unit 124 updates the coefficient of each term included in the polynomial used by the second distortion compensation unit 122 (Operation S48). The ACLR monitoring unit 225 again monitors the ACLR (Operation S49). That is, the processing in Operation S47 to Operation S50 is repeated. If the ACLR monitored by the ACLR monitoring unit 225 is equal to or larger than the threshold value Th1 (Yes in Operation S50), the polynomial adjusting unit 226 increments the maximum delay number K of the polynomial by 1 (Operation S51) and ends the processing.

As described above, the radio communication device 200 according to the third embodiment monitors the ACLR when compensating for the distortion, which is generated in the power amplifier 134, by using the polynomial. The radio communication device 200 increases and decreases the maximum degree N or the maximum delay number K of the polynomial according to the monitored ACLR. Specifically, if the distortion generated in the power amplifier 134 is varied from the standard value, that is, if the ACLR is equal to or larger than the threshold value Th1, the radio communication device 200 increases the current maximum degree N or the maximum delay number K to the maximum degree or the maximum delay number that satisfies the standard value. On the other hand, if the distortion generated in the power amplifier 134 is smaller than the standard value, that is, if the ACLR is smaller than the threshold value Th1, the radio communication device 200 decreases the current maximum degree N or the maximum delay number K within the range in which the standard value is satisfied. As a result, if the distortion generated in the power amplifier 134 is varied, the radio communication device 200 according to the third embodiment may compensate, with high accuracy, for the distortion generated in the power amplifier 134. If the distortion generated in the power amplifier 134 remains smaller than the standard value, the radio communication device according to the third embodiment reduces the calculation amount by the polynomial, so that the power consumption of the whole device may be reduced. That is, the radio communication device 200 according to the third embodiment may suppress the increase of the power consumption while maintaining the accuracy of distortion compensation.

A radio communication device that includes a distortion compensation device according to a fourth embodiment will be described. When compensating for the distortion, which is generated in the power amplifier, by using the polynomial, the radio communication device according to the fourth embodiment monitors a frequency bandwidth of a transmission signal as an example of a prescribed value indicating a degree of variation from the standard value of the distortion generated in the power amplifier. The radio communication device according to the fourth embodiment increases or decreases the maximum degree or the maximum delay number of the polynomial according to the monitored frequency bandwidth of the transmission signal.

Figure 12:
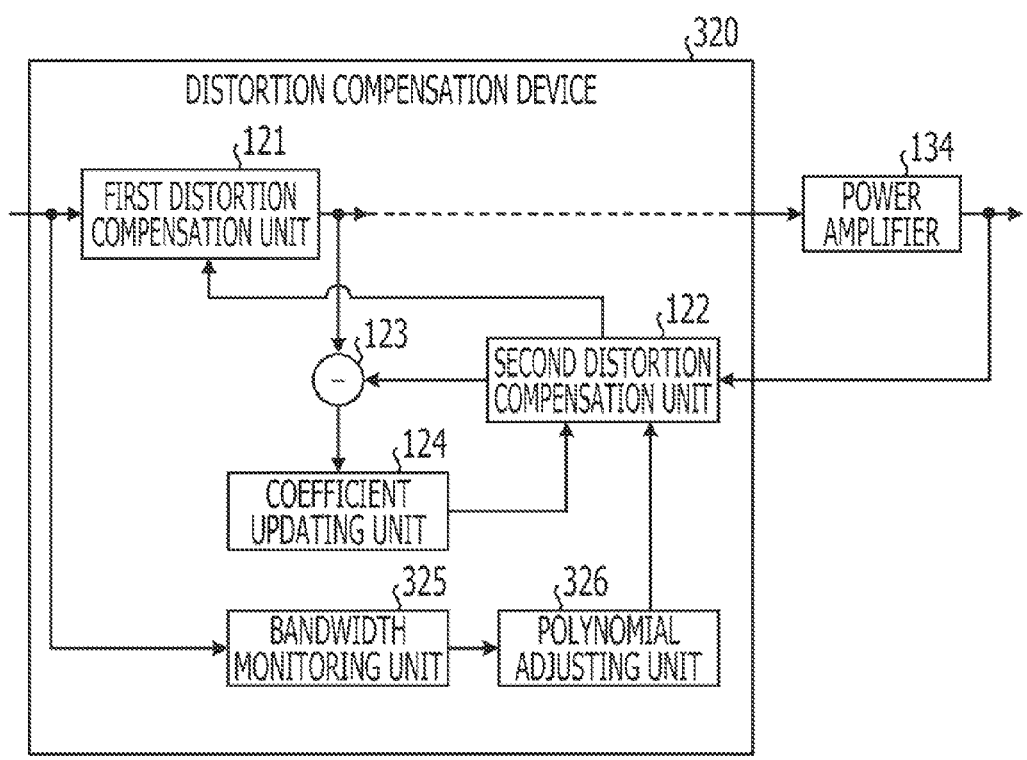
FIG. 12 is a diagram illustrating a configuration of a distortion compensation device according to a fourth embodiment.

The configuration of the radio communication device 300 according to the fourth embodiment will be described. FIG. 12 is a diagram illustrating a configuration of a distortion compensation device 320 according to the fourth embodiment. The components with substantially similar functions are indicated with the same numerals illustrated in FIG. 3. The configuration of the radio communication device 300 according to the fourth embodiment is equivalent to the components illustrated in FIG. 2, so that the description is omitted.

As illustrated in FIG. 12, the distortion compensation device 320 includes a bandwidth monitoring unit 325 and a polynomial adjusting unit 326 instead of the error monitoring unit 125 and the polynomial adjusting unit 126 included in the distortion compensation device 120 illustrated in FIG. 3.

The bandwidth monitoring unit 325 monitors the frequency bandwidth of the transmission signal as an example of the prescribed value indicating a degree of variation from the standard value of the distortion generated in the power amplifier 134. Specifically, the bandwidth monitoring unit 325 monitors a frequency bandwidth (hereinafter referred to as a "transmission bandwidth") of the transmission signal input from the transmission signal generating unit 110. The bandwidth monitoring unit 325 outputs the monitoring result to the polynomial adjusting unit 326. The bandwidth monitoring unit 325 is an example of the monitoring unit 12 illustrated in FIG. 1.

According to the monitoring result input from the bandwidth monitoring unit 325, the polynomial adjusting unit 326 increases or decreases the maximum degree N or the maximum delay number K of the polynomial used by the second distortion compensation unit 122. In general, if the transmission bandwidth is narrower, decrease of the distortion compensation performance caused by the memory effect and higher order degrees of non-linear distortion are not desired. Specifically, the polynomial adjusting unit 326 previously calculates the desired maximum degree or the desired maximum delay number where the distortion generated in the power amplifier 134 satisfies the standard value and stores the maximum degree or the maximum delay number in association with the transmission bandwidth in an internal table. The polynomial adjusting unit 326 reads, from the internal table, the maximum degree N or the maximum delay number according to the transmission bandwidth monitored by the bandwidth monitoring unit 325, and increases or decrease the current maximum degree or the current maximum delay number toward the read maximum degree or the read maximum delay number. If the transmission bandwidth monitored by the bandwidth monitoring unit 325 is narrower, the polynomial adjusting unit 326 decreases the maximum degree N or the maximum delay number K. If the transmission bandwidth monitored by the bandwidth monitoring unit 325 is wider, the polynomial adjusting unit 326 increases the maximum degree N or the maximum delay number K. The polynomial adjusting unit 326 is an example of the polynomial adjusting unit 13 illustrated in FIG. 1.

Figure 13:
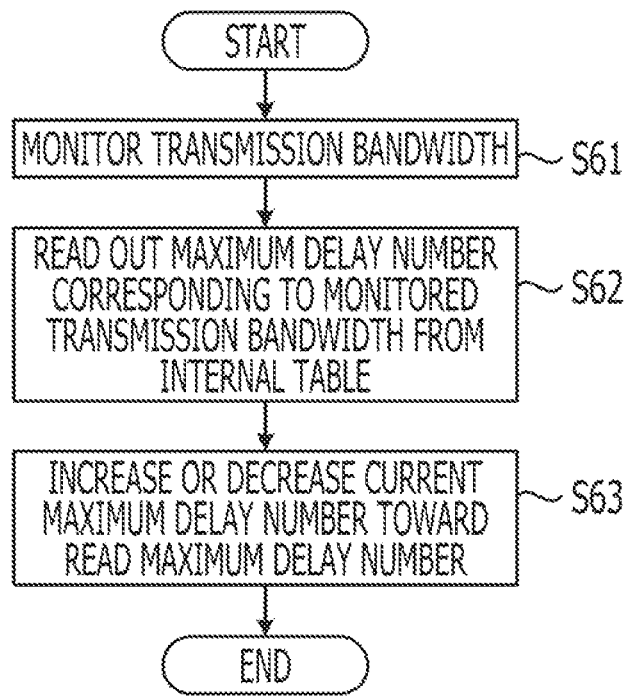
FIG. 13 is a flowchart illustrating a processing procedure by the distortion compensation device according to the fourth embodiment.

With reference to FIG. 13, a processing procedure by the distortion compensation device 320 according to the fourth embodiment will be described. FIG. 13 is a flowchart illustrating the processing procedure by the distortion compensation device 320 according to the fourth embodiment. FIG. 13 illustrates an example in which the distortion compensation device 320 increases or decreases the maximum delay number K of the polynomial.

As illustrated in FIG. 13, the bandwidth monitoring unit 325 of the distortion compensation device 320 monitors a transmission bandwidth (Operation S61). The polynomial adjusting unit 326 reads the maximum delay number according to the transmission bandwidth monitored by the bandwidth monitoring unit 325 from the internal table (Operation S62) and increases or decreases the current maximum delay number K toward the read maximum delay number (Operation S63).

As described above, when compensating for the distortion generated in the power amplifier 134 by using the polynomial, the radio communication device 300 according to the fourth embodiment monitors the transmission bandwidth indicating a degree of variation from the standard value of the distortion generated in the power amplifier 134. According to the monitored transmission bandwidth, the radio communication device 300 increases or decreases (determines) the maximum degree N or the maximum delay number K of the polynomial. As a result, if the distortion generated in the power amplifier 134 is varied from the standard value, the radio communication device 300 according to the fourth embodiment may compensate, with high accuracy, for the distortion generated in the power amplifier 134. If the distortion generated in the power amplifier 134 is not varied from the standard value, the radio communication device 300 according to the fourth embodiment reduces the calculation amount by the polynomial, so that the power consumption of the whole device may be reduced. That is, the radio communication device 300 according to the fourth embodiment may suppress the increase of the power consumption while maintaining the accuracy of distortion compensation.

The radio communication device that includes a distortion compensation device according to a fifth embodiment will be described. When compensating for the distortion, which is generated in the power amplifier, by using the polynomial, the radio communication device according to fifth embodiment monitors the power of the transmission signal as an example of a prescribed value indicating a degree of variation from the standard value of the distortion generated in the power amplifier. The radio communication device according to the fifth embodiment increases or decreases (determines) the maximum degree or the maximum delay number of the polynomial.

Figure 14:
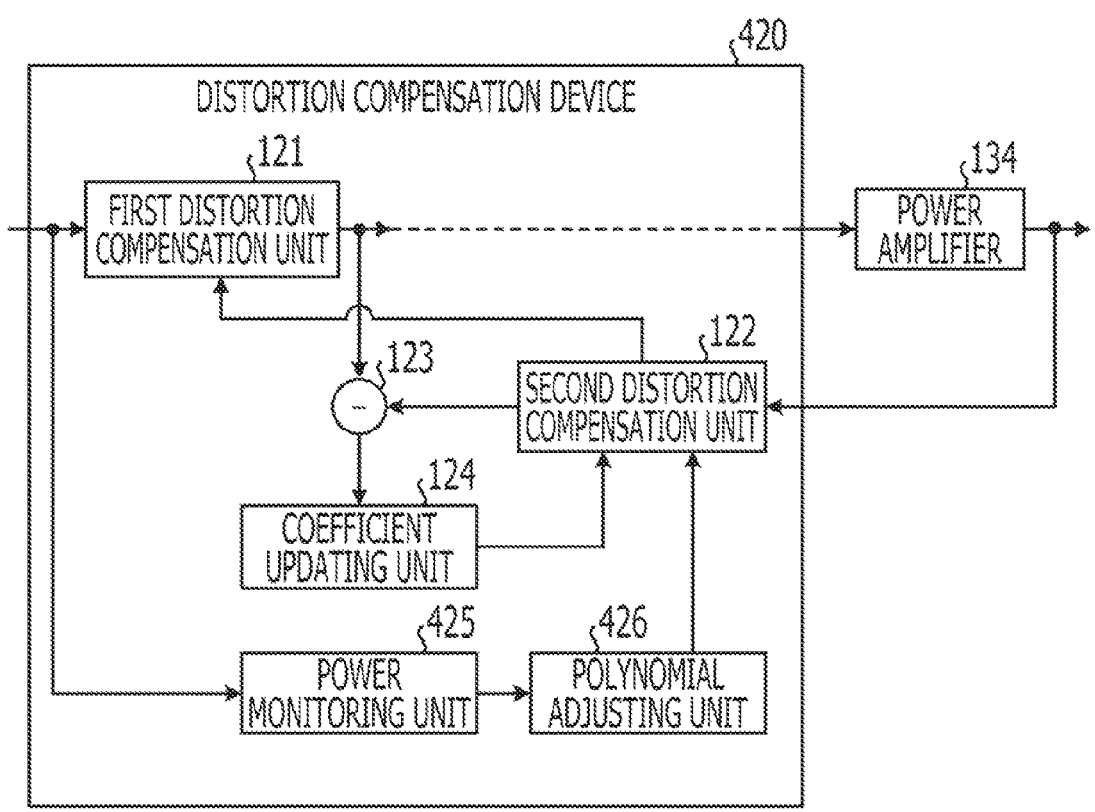
FIG. 14 is a diagram illustrating a configuration of a distortion compensation device according to a fifth embodiment.

The configuration of the distortion compensation device that includes the radio communication device 400 according to the fifth embodiment will be described. FIG. 14 is a diagram illustrating a configuration of a distortion compensation device 420 according to the fifth embodiment. Hereinafter, the components with functions substantially equivalent to the components illustrated in FIG. 3 are indicated with the same numerals, and the detailed description is omitted. The configuration of the radio communication device 400 according to the fifth embodiment is equivalent to the components illustrated in FIG. 2, and the description is omitted.

As illustrated in FIG. 14, the distortion compensation device 420 includes a power monitoring unit 425 and a polynomial adjusting unit 426 instead of the error monitoring unit 125 and the polynomial adjusting unit 126 included in the distortion compensation device 120 illustrated in FIG. 3.

The power monitoring unit 425 monitors the power of the transmission signal as an example of the prescribed value indicating a degree of variation from the standard value of the distortion generated in the power amplifier 134. Specifically, the power monitoring unit 425 monitors the power (hereinafter referred to as "transmission power") of the transmission signal input from the transmission signal generating unit 110. A peak power of the transmission signal or an average power of the transmission signal is used as the transmission power. The power monitoring unit 425 outputs the monitoring result to the polynomial adjusting unit 426. The power monitoring unit 425 is an example of the monitoring unit 12 illustrated in FIG. 1.

According to the monitoring result input from the power monitoring unit 425, the polynomial adjusting unit 426 increases or decreases the maximum degree N or the maximum delay number K of the polynomial used by the second distortion compensation unit 122. Specifically, the polynomial adjusting unit 426 calculates the desired maximum degree or the desired maximum delay number, in which the distortion generated in the power amplifier 134 satisfies the standard value, and stores the maximum degree or the maximum delay number in association with the transmission bandwidth in the internal table. The polynomial adjusting unit 426 reads, from the internal table, the maximum degree or the maximum delay number according to the transmission power monitored by the power monitoring unit 425, and increases or decreases the current maximum degree or the current maximum delay number toward the read maximum degree or the read maximum delay number. Accordingly, if the transmission power monitored by the power monitoring unit 425 is increased, the polynomial adjusting unit 426 may decrease the maximum degree N or the maximum delay number K. If the transmission power monitored by the power monitoring unit 425 is increased, the polynomial adjusting unit 426 may increase the maximum degree N or the maximum delay number K. The polynomial adjusting unit 426 is an example of the polynomial adjusting unit 13 illustrated in FIG. 1.

Figure 15:
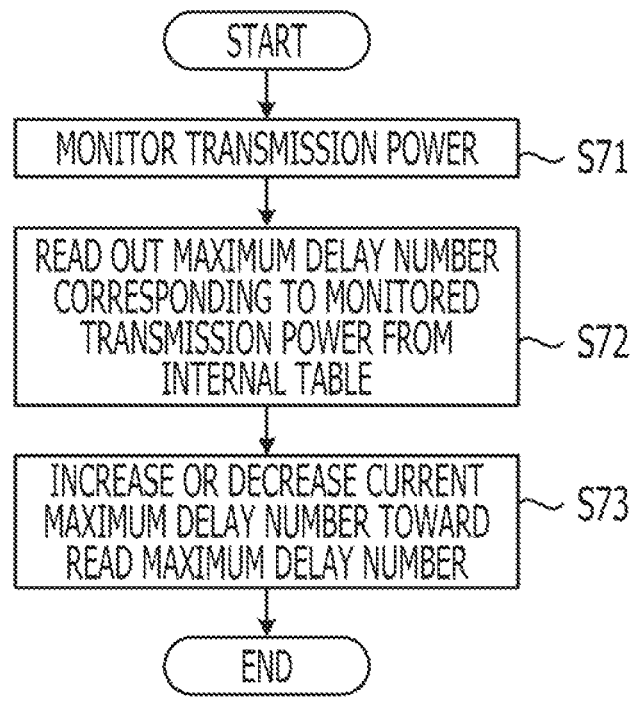
FIG. 15 is a flowchart illustrating a processing procedure of the distortion compensation device according to the fifth embodiment.

With reference to FIG. 15, a processing procedure by the distortion compensation device 420 according to the fifth embodiment will be described. FIG. 15 is a flowchart illustrating the processing procedure by the distortion compensation device 420 according to the fifth embodiment. FIG. 15 illustrates an example in which the distortion compensation device 420 increases or decreases the maximum delay number of the polynomial.

As illustrated in FIG. 15, the power monitoring unit 425 of the distortion compensation device 420 monitors a transmission power (Operation S71). The polynomial adjusting unit 426 reads, from the internal table, the maximum delay number according to the transmission power monitored by the power monitoring unit 425 (Operation S72) and increases or decreases the current maximum delay number N toward the read maximum delay number (Operation S73).

As illustrated above, when compensating for the distortion, which is generated in the power amplifier 134, by using the polynomial, the radio communication device 400 according to the fifth embodiment monitors the transmission power indicating a degree of variation from the standard value of the distortion generated in the power amplifier 134. The radio communication device 400 increases or decreases (determines) the maximum degree N or the maximum delay number K of the polynomial according to the monitored transmission power. If the distortion generated in the power amplifier 134 is not varied from the standard value, the radio communication device 400 according to the fifth embodiment reduces the calculation amount by the polynomial and may reduce the power consumption of the whole device.

That is, the radio communication device 400 according to the fifth embodiment may reduce the power consumption while maintaining the accuracy of distortion compensation.

The distortion compensation device and the like disclosed in the present invention are not limited to the above-described embodiments. In addition to the above-embodiments, the distortion compensation device and the like disclosed may be achieved in various forms. For example, the second to fifth embodiments have described a method of monitoring an error of the pre-distortion signal, an ACLR of the power amplifier, a transmission bandwidth, and a transmission power as a prescribed value indicating a degree of variation from the standard value of the distortion generated in the power amplifier. However, the disclosed technique is not limited to the above-described embodiments. If there is another index as a prescribed value that indicates a degree of variation from the standard value of the distortion generated in the power amplifier, the maximum degree or the maximum delay number of the polynomial may be increased or decreased by monitoring the value of the other index. For example, if deterioration of elapsed time indicates an index that represents a degree of variation from the standard value of the distortion generated in the power amplifier, the maximum degree or the maximum delay number of the polynomial may be increased or decreased by monitoring a usage length of the power amplifier.

The second to fifth embodiments have described a method of monitoring any one of an error of a pre-distortion signal, an ACLR of a power amplifier, a transmission frequency, and a transmission power as the prescribed value that indicates the degree of variation from the standard value of the distortion generated in the power amplifier. However, the disclosed technique is not limited to the above-described embodiments. The error of the pre-distortion signal, the ACLR of the power amplifier, the transmission bandwidth, and the transmission signal may be monitored almost the same time.

The second to fifth embodiments have described an example in which the pre-distortion signal by using a polynomial number as an example of the polynomial, a pre-distortion signal may be generated by using a polynomial other than the polynomial series.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiment(s) of the present invention(s) has(have) been described in detail, it should be understood that the various changes, substitutions, and alterations could be made hereto without departing from the spirit and scope of the invention.

What is claimed is:
1. A distortion compensation device comprising:
a distortion compensation unit which compensates for a distortion generated in a power amplifier by using a polynomial in which a signal to be input into a power amplifier is raised to a power of a degree N (N is an integer larger than 0) and the signal is delayed by a delay number K (K is an integer larger than 0); and
a polynomial adjusting unit which adjusts the degree N or the delay number K of the polynomial based on a comparison between a prescribed value, which indicates a degree of variation of the distortion generated in the power amplifier and a threshold value.

2. The distortion compensation device according to claim 1, comprising a monitoring unit which monitors the degree of the variation of the distortion generated in the power amplifier, wherein the polynomial adjusting unit increases the degree N or the delay number K of the polynomial used by the distortion compensation unit when the prescribed value monitored by the monitoring unit is equal to or larger than the threshold value, and decreases the degree N or the delay number K of the polynomial the prescribed value is smaller than the threshold value.

3. The distortion compensation device according to claim 2, wherein when the prescribed value is equal to or larger than the threshold value, the polynomial adjusting unit increases the degree N or the delay number K of the polynomial by searching the degree N or the delay number K while the degree N or the delay number K of the polynomial is gradually increased so that the prescribed value is equal to or smaller than the threshold value.

4. The distortion compensation device according to claim 1, wherein the distortion compensation device further comprises a coefficient updating unit which updates the coefficient of each term included in the polynomial used by the distortion compensation unit in ascending order of the degree or the delay number corresponding to the coefficient.

5. A radio communication device comprising:
a power amplifier configured to amplify a power of an input signal; and
a processor configured to compensate for a distortion generated in the power amplifier by using a polynomial in which a signal to be input into the power amplifier is raised to a power of a degree N (N is an integer larger than 0) and the signal is delayed by a delay number K (K is an integer larger than 0), and adjust
the degree N or the delay number K of the polynomial based on a comparison between a prescribed value, which indicates a degree of variation of the distortion generated in the amplifier, and the threshold value.

6. A distortion compensating method which is performed by a distortion compensation device comprising:
distortion compensating of a distortion generated in a power amplifier by using a polynomial in which a signal to be input into the power amplifier is raised to the power of a degree N (N is an integer larger than 0) and the signal is delayed by a delay number K (N is an integer larger than 0); and
polynomial adjusting of the degree N or the delay number K of the polynomial based on a difference between a prescribed value that indicates a degree of variation of distortion generated in the power amplifier and a threshold value.

* * * * *